US007944005B2

(12) United States Patent
Chun

(10) Patent No.: US 7,944,005 B2
(45) Date of Patent: May 17, 2011

(54) SEMICONDUCTOR DEVICE AND METHOD FOR FABRICATING THE SAME

(75) Inventor: Yun Seok Chun, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 971 days.

(21) Appl. No.: 11/819,855

(22) Filed: Jun. 29, 2007

(65) Prior Publication Data
US 2008/0224209 A1 Sep. 18, 2008

(30) Foreign Application Priority Data

Mar. 15, 2007 (KR) .................. 10-2007-0025696

(51) Int. Cl.
*H01L 29/78* (2006.01)
*H01L 21/70* (2006.01)
*H01L 23/48* (2006.01)
*H01L 23/52* (2006.01)
*H01L 29/40* (2006.01)
*H01L 21/8238* (2006.01)
*H01L 21/336* (2006.01)
*H01L 21/3205* (2006.01)
*H01L 21/4763* (2006.01)

(52) U.S. Cl. . 257/412; 257/369; 257/770; 257/E29.159; 257/E21.635; 438/199; 438/212; 438/218; 438/270; 438/588; 438/589

(58) Field of Classification Search ..................... None
See application file for complete search history.

(56) References Cited

U.S. PATENT DOCUMENTS

| 5,545,925 | A | * | 8/1996 | Hanaoka | ........... 257/755 |
| 5,877,074 | A | | 3/1999 | Jeng et al. | |
| 6,921,711 | B2 | | 7/2005 | Cabral et al. | |
| 7,285,485 | B2 | * | 10/2007 | Chun et al. | ........ 438/589 |
| 2001/0036728 | A1 | * | 11/2001 | Shinmura et al. | ...... 438/660 |
| 2007/0018220 | A1 | | 1/2007 | Lee et al. | |
| 2009/0134465 | A1 | * | 5/2009 | Shimizu | ........... 257/368 |

* cited by examiner

*Primary Examiner* — Hoang-Quan T Ho
(74) *Attorney, Agent, or Firm* — IP & T Group LLP

(57) ABSTRACT

A semiconductor device includes a semiconductor substrate including an NMOS region and a PMOS region, active regions of the semiconductor substrate defined by a device isolation structure formed in the semiconductor substrate, the active regions including an NMOS active region defined in the NMOS region and a PMOS active region defined in the PMOS region, a gate insulating film disposed over the active regions, and a dual poly gate including an amorphous titanium layer formed over the gate insulating film in the NMOS region and the PMOS region. The dual poly gate includes a stacked structure having a lower gate electrode formed of an impurity doped polysilicon layer, a barrier layer including the amorphous titanium layer, and an upper gate electrode formed of a tungsten layer.

20 Claims, 10 Drawing Sheets

SEMICONDUCTOR DEVICE AND METHOD FOR FABRICATING THE SAME

CROSS-REFERENCES TO RELATED APPLICATIONS

The present invention claims the benefit of priority to Korean patent application number 10-2007-0025696, filed on Mar. 15, 2007, the entire contents of which are incorporated herein by reference.

BACKGROUND

The invention relates to a semiconductor device. More particularly, the invention relates to a semiconductor device comprising a dual poly gate and a method for fabricating the same.

In the fabrication of a dual CMOS transistor, an NMOS region includes an N-type impurity doped polysilicon layer as a lower gate electrode and a PMOS region includes a P-type impurity doped polysilicon layer as a lower gate electrode. A surface channel transistor is formed in the NMOS region and the PMOS region. A metal layer, such as a tungsten (W) layer, is formed as an upper gate electrode over a lower gate electrode to obtain a low word line resistance.

A surface channel transistor is required due to the continued increase in semiconductor device integration and on the necessity of a low operation voltage. However, the dual CMOS transistor has limits, such as boron penetration and gate depletion in a PMOS transistor. Because a barrier layer is formed between the upper gate electrode and the lower gate electrode, it is possible that the gateon insulator ("GOI") may fail, the ring oscillator may delay, and the resistance increase of a word line can be generated depending on the kinds and the formation conditions of the barrier layer, thereby degrading the performance of the transistor.

The barrier layer may be selected from the group consisting of a tungsten nitride (WN) layer, a tungsten silicide (WSi$_x$)/tungsten nitride (WN) layer, and a titanium (Ti)/tungsten nitride (WN) layer, and combinations thereof. When a tungsten layer is used as the upper gate electrode, a low word line surface resistance can be obtained. However, when the barrier layer is formed with a stacked structure including a tungsten silicide (WSi$_x$)/tungsten nitride (WN) layer, the barrier layer can react with boron in the PMOS region.

For example, a thermal treatment process is performed after a word line is formed to activate impurities. However, the tungsten silicide layer does not intercept diffusion of boron. The boron of the PMOS region reacts with nitride of the tungsten nitride layer to form a boron (B)-nitride (N) insulating film, thereby increasing a surface resistance. As a result, a gate delay is caused in the device operation. The insulating film results in signal delay, because the insulating film has a similar insulating property to that of a SiO$_2$ film. The tungsten nitride film does not serve as a barrier layer to generate silicidation of the upper gate electrode. This causes the lower gate electrode and tungsten silicide (WSi$_x$) to agglomerate, thereby degrading the function as an electrode.

When the barrier layer is formed with a stacked structure of a Ti/WN layer, the Ti layer interrupts boron diffusion of the lower gate electrode to inhibit formation of the B—N insulating film. However, the tungsten nitride (WN)/tungsten (W) layer is formed to have a small grain size due to effects of titanium (Ti) layer or titanium nitride (TiN) layer, thereby increasing the resistance of the word line.

SUMMARY

Embodiments consistent with the invention are directed to a semiconductor device comprising a dual poly gate that includes an amorphous titanium layer to improve an interface property.

According to one embodiment, a semiconductor device comprises a semiconductor substrate including an NMOS region and a PMOS region, active regions of the semiconductor substrate defined by a device isolation structure formed in the semiconductor substrate, the active regions including an NMOS active region defined in the NMOS region, and a PMOS active region defined in the PMOS region, a gate insulating film disposed over the active regions, and a gate including an amorphous titanium layer formed over the gate insulating film in the NMOS region and the PMOS region.

According to another embodiment, a semiconductor device comprises a semiconductor substrate including an NMOS region and a PMOS region, active regions of the semiconductor substrate defined by a device isolation structure formed in the semiconductor substrate, the active regions including an NMOS active region defined in the NMOS region, and a PMOS active region defined in the PMOS region, three-dimensional recess channel structures formed in the semiconductor substrate in the active regions, a gate insulating film disposed over the active regions, the active regions including the three-dimensional recess channel structures, and a dual poly gate including an amorphous titanium layer formed over the gate insulating film, the dual poly gate filling the three-dimensional recess channel structures. The dual poly gate includes a stacked structure having a lower gate electrode, a barrier layer including the amorphous titanium layer, and an upper gate electrode. Further, the lower gate electrode comprises an n-type impurity doped polysilicon layer in the NMOS region and a p-type impurity doped polysilicon layer in the PMOS region, and the upper gate electrode comprises a tungsten layer.

According to one embodiment, a method for fabricating a semiconductor device is provided. The method comprises forming a device isolation structure on a semiconductor substrate including an NMOS region and a PMOS region to define active regions in at least the NMOS region and the PMOS region, forming a gate insulating film over the active regions, forming an n-type first conductive layer over the gate insulating film in the NMOS region and a p-type first conductive layer over the gate insulating film in the PMOS region, forming a barrier layer including an amorphous titanium layer over the n-type conductive layer and the p-type conductive layer, forming a second conductive layer over the barrier layer, and patterning the second conductive layer, the barrier layer, and the first conductive layer to form a gate structure.

According to another embodiment, there is provided a method for fabricating a semiconductor device. The method comprises forming a device isolation structure on a semiconductor substrate including an NMOS region and a PMOS region to define active regions in at least the NMOS region and the PMOS region, forming a three-dimensional recess channel structure in the semiconductor substrate under the active region, forming a gate insulating film over the active region including the three-dimensional recess channel structure, forming an impurity doped polysilicon layer over the gate insulating film to fill the three-dimensional recess channel structure, forming a barrier layer including an amorphous titanium layer over the impurity doped polysilicon layer, forming a tungsten layer over the barrier layer, and patterning the tungsten layer, the barrier layer, and the impurity doped polysilicon layer to form a dual poly gate. The dual poly gate includes an NMOS gate structure in the NMOS region and a PMOS gate structure in the PMOS region.

According to one embodiment, a gate electrode for a semiconductor device comprises a lower gate electrode, an upper gate electrode over the lower gate electrode, and a barrier layer between the lower gate electrode and the upper gate electrode, the barrier layer comprising an amorphous titanium layer.

DETAILED DESCRIPTION

Figure 1:
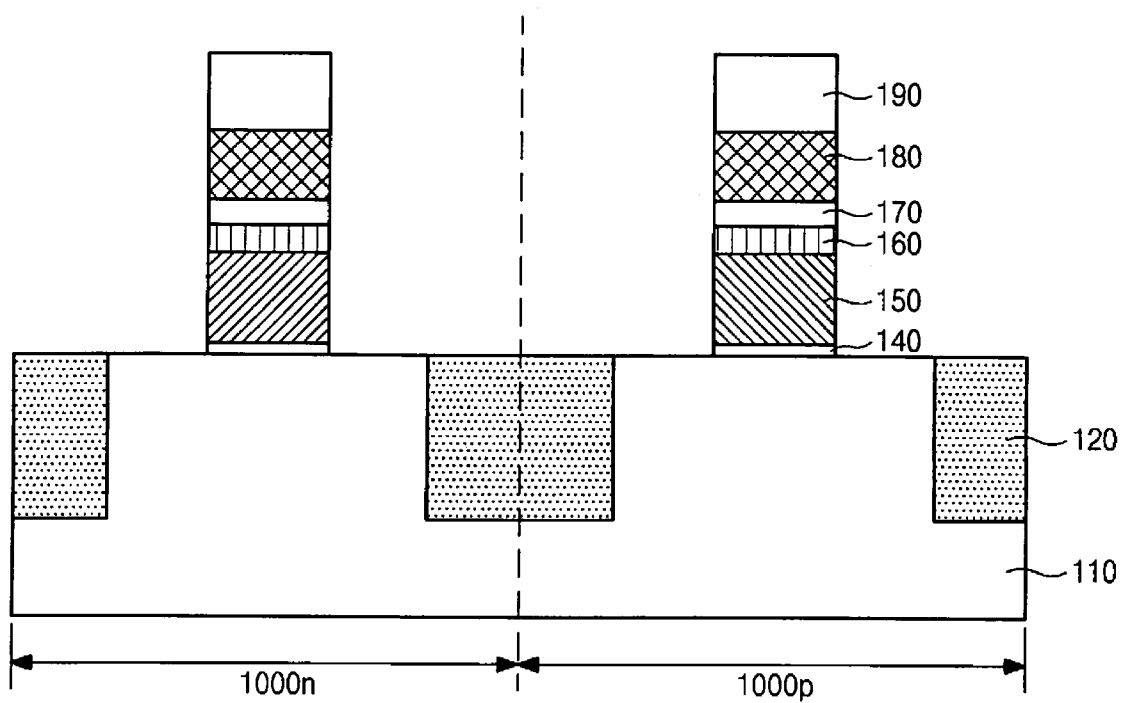
FIG. 1 is a cross-sectional view illustrating a semiconductor device according to an embodiment consistent with the present invention.

FIG. 1 is a cross-sectional view illustrating a semiconductor device according to an embodiment consistent with the present invention. The semiconductor device includes a CMOS transistor including a dual poly gate having an NMOS gate and a PMOS gate. The semiconductor device comprises a device isolation structure 120, a gate insulating film 140, a lower gate electrode 150, an amorphous titanium layer 160, a barrier layer 170, an upper gate electrode 180, and a gate hard mask layer 190.

Device isolation structure 120 is formed in semiconductor substrate 110 to define an active region (not shown). Semiconductor substrate 110 includes an NMOS region 1000n and a PMOS region 1000p. Gate insulating film 140 is disposed over semiconductor substrate 110 in the active region. Semiconductor substrate 110 may be a P-type silicon substrate. Device isolation structure 120 may be formed by a shallow trench isolation ("STI") method. Gate insulating film 140 may be formed under a temperature in a range of about 800° C. to 1,000° C. by a wet method with a thickness in a range of about 10 Å to 100 Å. Gate insulating film 140 may also be formed by a dual gate insulating film method in NMOS region 1000n and PMOS region 1000p. Further, gate insulating film 140 may be formed by a plasma nitrified oxidation method or a radical oxidation method.

Lower gate electrode 150 is disposed over gate insulating film 140. Amorphous titanium layer 160 and barrier layer 170 are disposed between lower gate electrode 150 and upper gate electrode 180. Gate hard mask layer 190 is disposed over upper gate electrode 180. Lower gate electrode 150 may be an impurity doped polysilicon layer. Lower gate electrode 150 in NMOS region 1000n may be doped with n-type impurity ions including phosphorus isotope $P^{31}$. Lower gate electrode 150 in PMOS region 1000p may be doped with p-type impurity ions including boron isotope $B^{11}$. A thickness of lower gate electrode 150 is in a range of about 600 Å to 1,000 Å.

Amorphous titanium layer 160 is formed between lower gate electrode 150 and upper gate electrode 180 to lower the surface resistance of lower and upper gate electrodes 150 and 180. A thickness of amorphous titanium layer 160 is in a range of about 20 Å to 40 Å. Barrier layer 170 disposed over amorphous titanium layer 160 may include a tungsten nitride (WN) film with a thickness in a range of about 30 Å to 70 Å.

Upper gate electrode 180 is disposed over barrier layer 170. Upper gate electrode 180 may include a tungsten (W) layer with a thickness in a range of about 200 Å to 1,000 Å, preferably about 300 Å to 700 Å.

Figure 2:
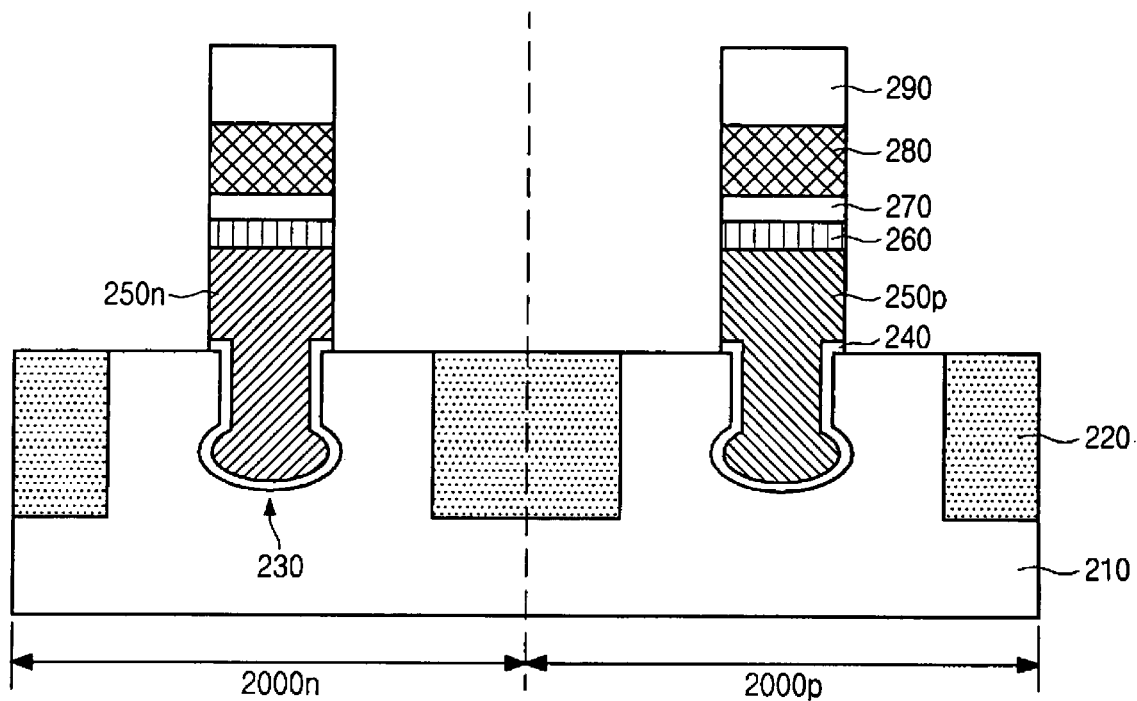
FIG. 2 is a cross-sectional view illustrating a semiconductor device according to an embodiment consistent with the present invention.

FIG. 2 is a cross-sectional view illustrating a semiconductor device according to an embodiment consistent with the present invention. The semiconductor device includes a CMOS transistor having a three-dimensional recess channel structure and a dual poly gate having an NMOS gate and a PMOS gate. The semiconductor device comprises a device isolation structure 220, a three-dimensional recess channel structure 230, a gate insulating film 240, a lower gate electrode 250, an amorphous titanium layer 260, a barrier layer 270, an upper gate electrode 280, and a gate hard mask layer 290.

Device isolation structure 220 is formed in semiconductor substrate 210 to define an active region (not shown). Semiconductor substrate 210 includes an NMOS region 2000n and a PMOS region 2000p. Three-dimensional recess channel structure 230 is formed in semiconductor substrate 210 in the active region of the NMOS region 2000n and the PMOS region 2000p. As shown in FIG. 2, three-dimensional recess channel structure 230 is formed to have a bulb shape, and is commonly known as a bulb-type recess channel structure. A depth of bulb-type recess channel structure 230 is in a range of about 1,000 Å to 2,000 Å from a top surface of the active region. It is understood that three-dimensional recess channel structure 230 is not limited to the bulb-type recess channel structure, but can be applied to all possible types of cell and dual poly gate structures.

Gate insulating film 240 is disposed over semiconductor substrate 210 in a gate region (not shown) and in three-dimensional recess channel structure 230. Gate insulating film 240 may be disposed by using a wet method to have a thickness in a range of about 10 Å to 100 Å under a temperature in a range of about 800° C. to 1,000° C. Gate insulating film 240 may be formed by a dual gate insulating film method in NMOS region 2000n and PMOS region 2000p. Gate insulating film 240 may also be formed by a plasma nitrified oxidation method or a radical oxidation method.

A lower gate electrode (formed as 250n and 250p) is disposed over gate insulating film 240 to fill three-dimensional recess channel structure 230. Lower gate electrode 250 may be formed of a poly silicon layer doped with impurities including P-type ions. The polysilicon layer may be formed by a low pressure chemical deposition ("LPCVD") method using a source gas including $PH_3$ and $SiH_4$ under a pressure in a range of about 5 Torr to 80 Torr and a temperature in a range of about 450° C. to 600° C. to have a thickness in a range of about 500 Å to 1,500 Å. In addition, the polysilicon layer may be formed under a pressure in a range of about 10 Torr to 30 Torr and a temperature in a range of about 510° C. to 550° C. to have a thickness in a range of about 600 Å to 1,000 Å. A dosage of $PH_3$ is in a range of about 1.0E20 ions/cm$^2$ to 3.0E20 ions/cm$^2$.

Amorphous titanium layer 260 and barrier layer 270 are disposed between lower gate electrode 250 and upper gate electrode 280 to lower a surface resistance. A thickness of amorphous titanium layer 260 is in a range of about 10 Å to 60 Å, or in a range of about 20 Å to 40 Å. Barrier layer 270 may include a tungsten nitride (WN) film. A thickness of barrier layer 270 may be in a range of about 20 Å to 100 Å, or in a range of about 30 Å to 70 Å.

Upper gate electrode 280 is disposed over barrier layer 270. Gate hard mask layer 290 is disposed over upper gate electrode 280. Upper gate electrode 280 may include a metal layer, such as a tungsten (W) layer, having a thickness in a range of about 300 Å to 700 Å.

In order to form a PMOS, lower gate electrode 250 in the PMOS region 200p further comprises P-type impurity ions implanted by a counter doping process. The counter doping process may be performed using p-type impurities including boron isotope $B^{11}$ with a dosage in a range of about 5.0E15 ions/cm$^2$ to 5.0E17 ions/cm$^2$ and energy in a range of about 1 keV to 10 keV. The counter doping process may also be performed with a dosage in a range of about 1.0E16 ions/cm$^2$ to 9.0E16 ions/cm$^2$ and energy in a range of about 3 keV to 7 keV.

FIGS. 3a through 3f are cross-sectional views illustrating a method for fabricating a semiconductor device according to an embodiment consistent with the present invention. A device isolation structure 320 is formed in a semiconductor substrate 310 to define an active region (not shown). Semiconductor substrate 310 includes an NMOS region 3000n and a PMOS region 3000p by a shallow trench isolation ("STI") method. Impurity ions may be implanted into semiconductor substrate 310 having device isolation structure 320 to form a well and a channel ion-implanting region (not shown). A gate insulating film 340 is formed over semiconductor substrate 310 and etched to expose device isolation structure 320. A lower gate conductive layer 350 is formed over semiconductor substrate 310 and device isolation structure 320.

Semiconductor substrate 310 may be a P-type silicon substrate. Gate insulating film 340 may be formed by a wet method under a temperature in a range of about 800° C. to 1,000° C. with a thickness in a range of about 10 Å to 100 Å. Gate insulating film 340 may also be formed by a dual gate insulating film method in NMOS region 3000n and PMOS region 3000p. Further, gate insulating film 340 may be formed by a plasma nitrified oxidation method or a radical oxidation method.

Lower gate conductive layer 350 includes an undoped amorphous silicon layer. The undoped amorphous silicon layer may be formed using a source gas including $Si_2H_6$ under a pressure in a range of about 0.1 Torr to 1.0 Torr and a temperature in a range of about 450° C. to 600° C. to have a thickness in a range of about 500 Å to 1,500 Å. In addition, the undoped amorphous silicon layer may also be formed in a range of about 0.1 Torr to 0.3 Torr and a temperature in a range of about 480° C. to 540° C. to have a thickness in a range of about 600 Å to 1,000 Å.

Figure 3A:
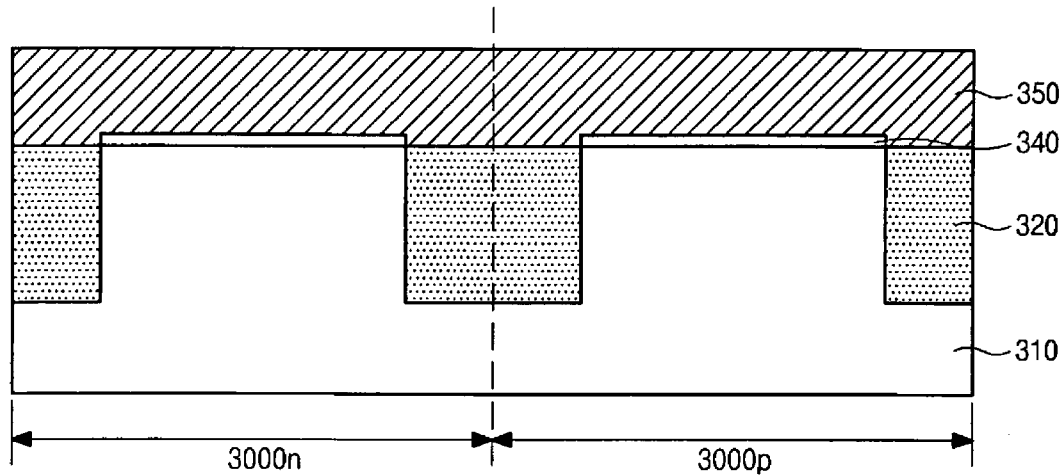
FIGS. 3a through 3f are cross-sectional views illustrating a method for fabricating a semiconductor device according to an embodiment consistent with the present invention.
Figure 3B:
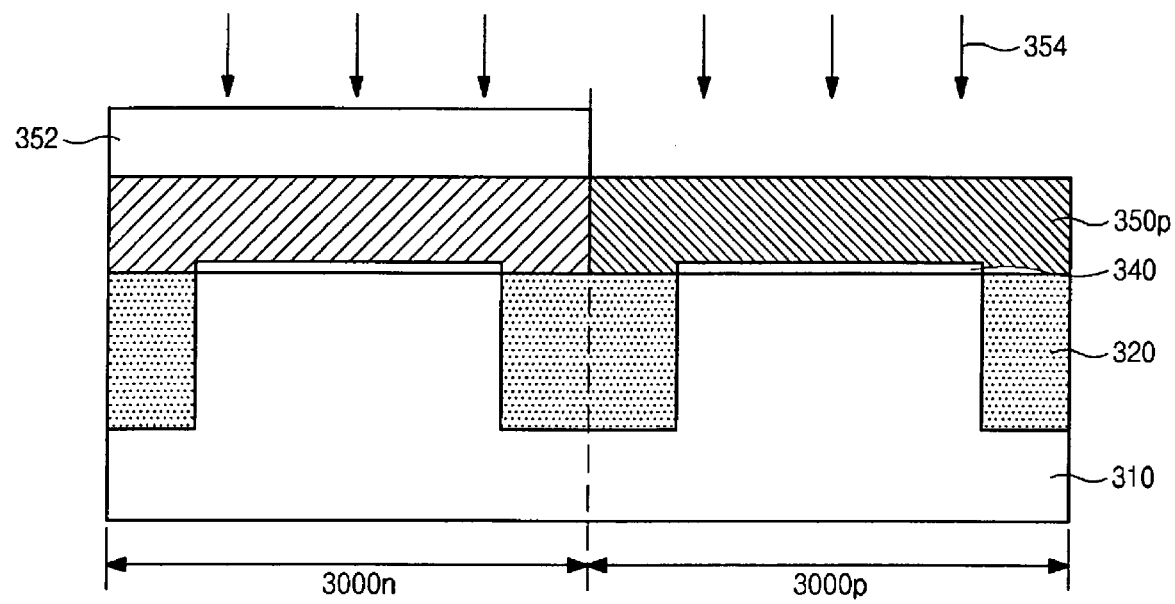
Figure 3C:
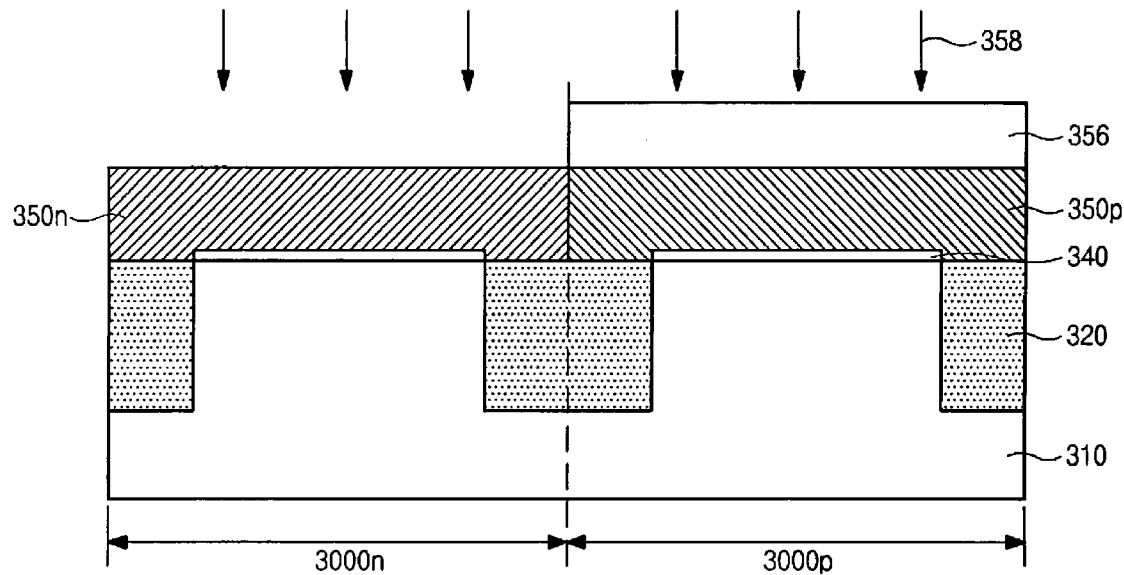

Referring to FIGS. 3b and 3c, a photoresist film is formed over semiconductor substrate 310. The photoresist film is exposed and developed using a mask (not shown) that exposes PMOS region 3000p, to form a photoresist pattern 352. A first ion-implanting process 354 is performed on exposed lower gate conductive layer 350 to form a PMOS lower gate conductive layer 350p. Photoresist pattern 352 is then removed. A photoresist film (not shown) is formed over semiconductor substrate 310. The photoresist film is exposed and developed using a mask (not shown) to expose NMOS region 3000n, thereby forming a photoresist pattern 356. A second ion-implanting process 358 is performed on exposed lower gate conductive layer 350 to form a NMOS lower gate conductive layer 350n. Lower gate conductive layer 350 includes PMOS lower gate conductive layer 350p and NMOS lower gate conductive layer 350n.

First ion-implanting process 354 may be performed using p-type impurities including boron isotope $B^{11}$ with a dosage in a range of about 1.0E15 ions/cm$^2$ to 5.0E16 ions/cm$^2$ and energy in a range of about 1 keV to 10 keV. First ion-implanting process 354 may also be performed with a dosage in a range of about 1.0E15 ions/cm$^2$ to 9.0E15 ions/cm$^2$ and energy in a range of about 2 keV to 6 keV. Second ion-implanting process 358 may be performed using n-type impurities including phosphorus isotope $P^{31}$ with a dosage in a range of about 1.0E15 ions/cm$^2$ to 5.0E16 ions/cm$^2$ and energy in a range of about 1 keV to 30 keV. Second ion-implanting process 358 may also be performed with a dosage in a range of about 1.0E15 ions/cm$^2$ to 9.0E15 ions/cm$^2$ and energy in a range of about 10 keV to 20 keV.

Figure 3D:
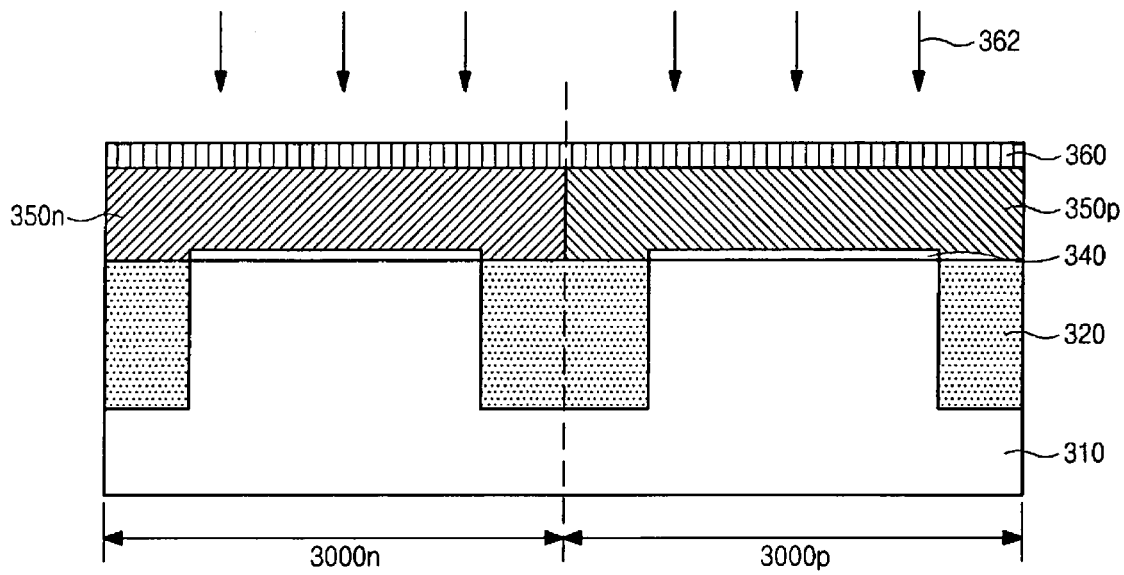
Figure 3E:
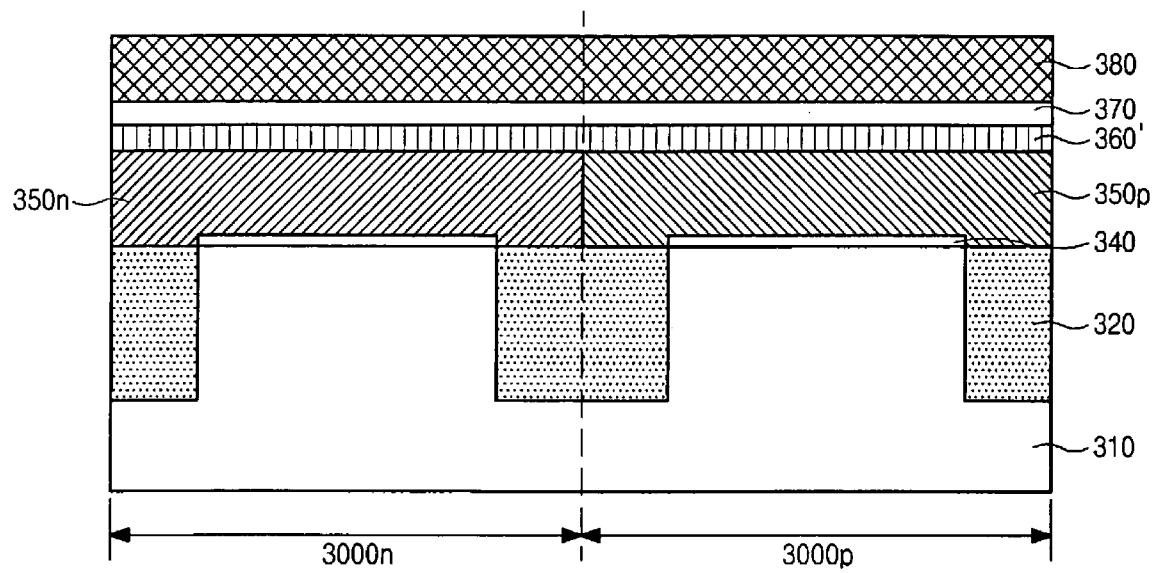
Figure 3F:
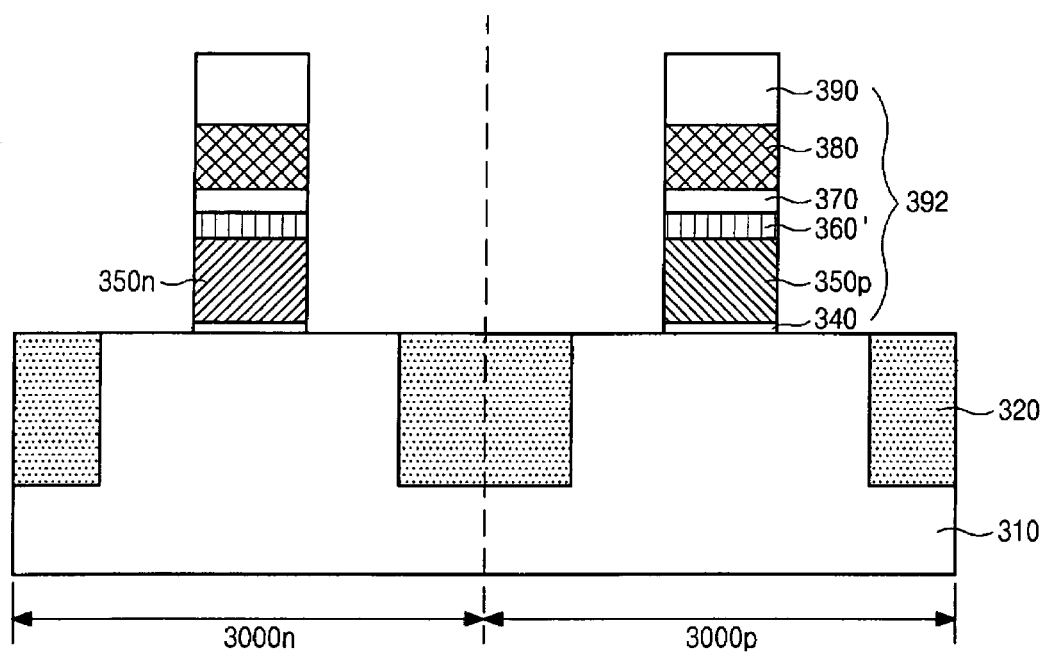

Referring to FIGS. 3d to 3f, photoresist pattern 356 is removed. A titanium layer 360 is formed over lower gate conductive layer 350. A blanket ion-implanting process 362 is performed on titanium layer 360 to form an amorphous titanium layer 360'. A barrier layer 370 is formed over amorphous titanium layer 360'. An upper gate conductive layer 380 and a gate hard mask layer 390 are formed over barrier layer 370. Gate hard mask layer 390, upper gate conductive layer 380, barrier layer 370, amorphous titanium layer 360, lower gate conductive layer 350, and gate insulating film 340 are patterned to form a gate structure 392 in NMOS region 3000n and PMOS region 3000p.

Titanium layer 360 may have a thickness in a range of about 10 Å to 60 Å, or in a range of about 20 Å to 40 Å. Blanket ion-implanting process 362 may be performed on titanium layer 360 using N-type ions with a dosage in a range of about 1.0E13 ions/cm$^2$ to 1.0E14 ions/cm$^2$ and energy in a range of about 2 keV to 20 keV. In addition, blanket ion-implanting process 362 may also be performed with a dosage in a range of about 1.0E13 ions/cm$^2$ to 9.0E13 ions/cm$^2$ and energy in a range of about 2 keV to 8 keV.

Barrier layer 370 may include a tungsten nitride (WN) film. A thickness of barrier layer 370 may be in a range of about 20 Å to 100 Å, or in a range of about 30 Å to 70 Å. Amorphous titanium layer 360' and barrier layer 370 are used as a barrier layer between lower gate conductive layer 350 and upper gate conductive layer 380. Upper gate electrode 380 may include a tungsten (W) layer. A thickness of upper gate electrode 380 may be in a range of about 200 Å to 1000 Å, or in a range of about 300 Å to 700 Å.

FIGS. 4a through 4i are cross-sectional views illustrating a method for fabricating a semiconductor device according to another embodiment consistent with the present invention. A pad insulating film 412 is formed over a semiconductor substrate 410 including an NMOS region 4000n and a PMOS region 4000p. Pad insulating film 412 and a portion of semiconductor substrate 410 are etched to form a trench (not shown) that defines an active region. A device isolation film (not shown) is formed over semiconductor substrate 410 to fill the trench. The device isolation film is polished until pad insulating film 412 is exposed, thereby forming a device isolation structure 420. Impurity ions are implanted into semiconductor substrate 410 having device isolation structure 420 to form a well and channel ion-implanting region (not shown). Pad insulating film 412 may be selected from the group consisting of an oxide film, a nitride film, and a combination thereof. A thickness of pad insulating film 412 may be in a range of about 50 Å to 100 Å.

Figure 4A:
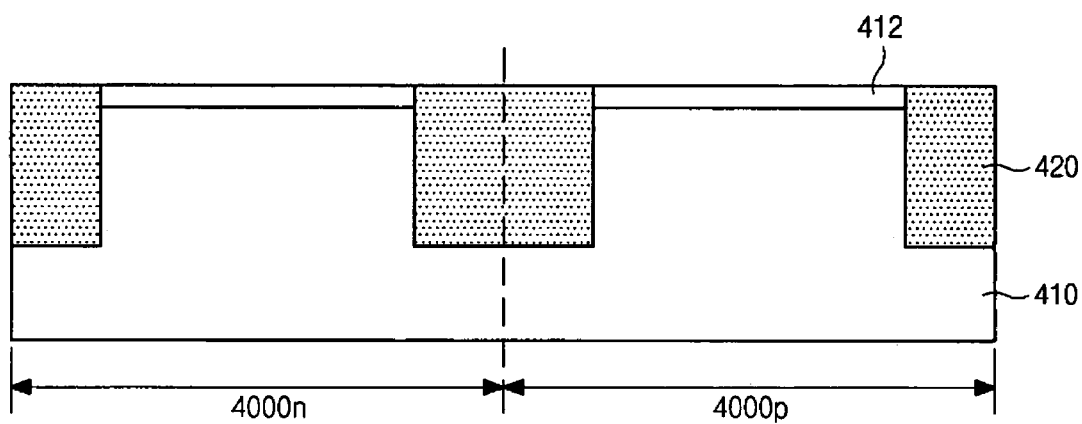
FIGS. 4a through 4i are cross-sectional views illustrating a method for fabricating a semiconductor device according to an embodiment consistent with the present invention.
Figure 4B:
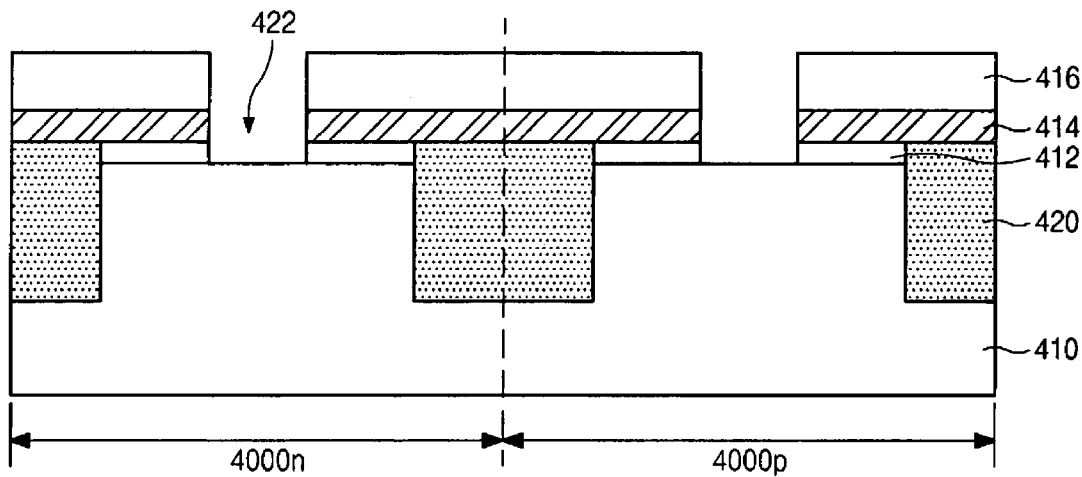
Figure 4C:
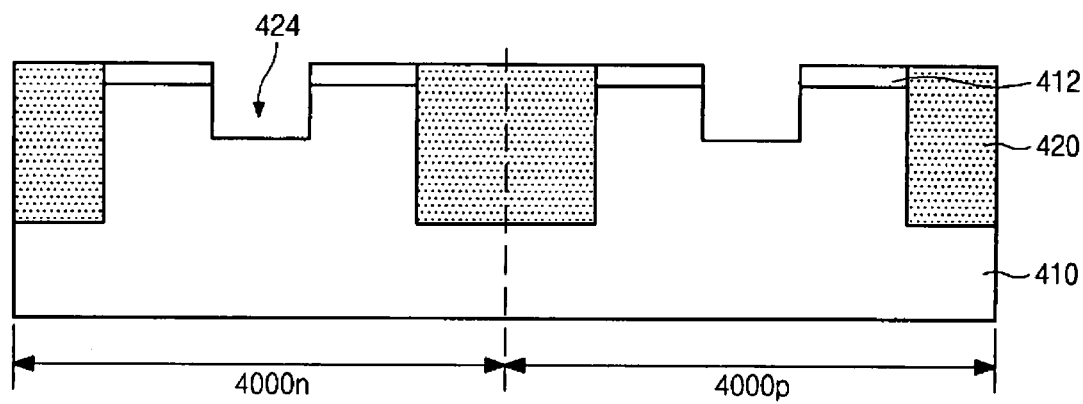

Referring to FIGS. 4b and 4c, a hard mask layer 414 is formed over semiconductor substrate 410. A photoresist film (not shown) is formed over hard mask layer 414. The photoresist film is exposed and developed using a recess gate mask (not shown) to form a photoresist pattern 416 that defines a recess gate region. Hard mask layer 414 and pad insulating film 412 are etched using photoresist pattern 416 as an etching mask, to form a recess region 422 that exposes underlying semiconductor substrate 410. Photoresist pattern 416 is then removed. A portion of exposed semiconductor substrate 410 is etched using hard mask layer 414 as an etching mask, thereby forming a first recess 424. Hard mask layer 414 includes a polysilicon layer. A thickness of hard mask layer 414 is in a range of about 1,000 Å to 2,000 Å. Recess region 422 is formed in a gate region. A line width of recess region 422 is smaller than the width of the gate region. In the etching process for forming first recess 424, hard mask layer 414 is removed.

Figure 4D:
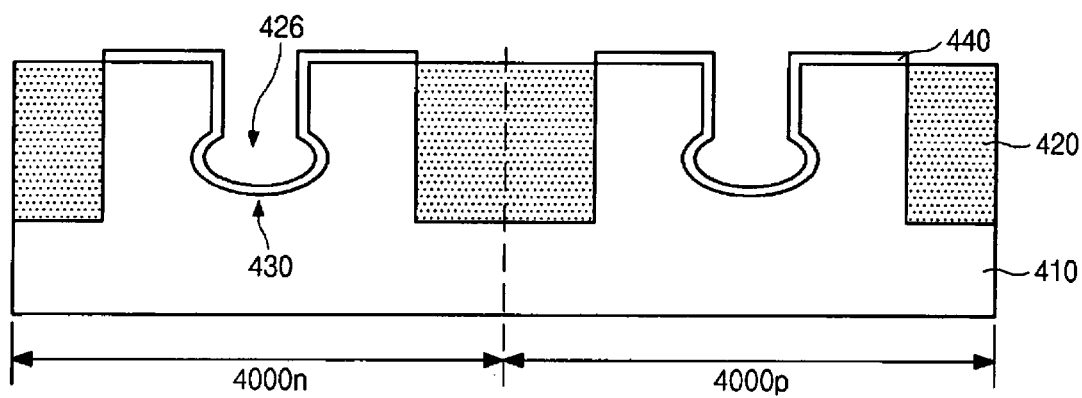

Referring to FIG. 4d, semiconductor substrate 410 exposed in first recess 424 is further etched to form a second recess 426. First recess 424 and second recess 426 define a recess channel structure 430. A longitudinal width of second recess 426 is larger than the width of first recess 424. Pad insulating film 412 is removed to expose semiconductor substrate 410 and a top surface in recess channel structure 430. A sacrificial oxide film (not shown) is formed to recover a damage generated when recess channel structure 430 is formed in semiconductor substrate 410. Impurity ions are implanted into semiconductor substrate 410 in order to regulate a threshold voltage. The sacrificial oxide film is removed by a cleaning process to expose semiconductor substrate 410. A gate insulating film 440 is formed over semiconductor substrate 410 and in recess channel structure 430.

A vertical depth of recess channel structure 430 is in a range of about 1,000 Å to 2,000 Å. The etching process for forming second recess 426 may be performed by an isotropic etching process. The process of removing pad insulating film 412 may be performed by a wet etching process. The cleaning process for removing the sacrificial oxide film may be performed using HF. The sacrificial oxide film is formed to have a thickness that minimizes damage in device isolation structure 420. The impurity ion-implanting process for regulating a threshold voltage may be performed using $BF_2$, $P^{31}$, and $As^{75}$.

Gate insulating film 440 may be formed by a wet or dry oxidation method in a furnace under a temperature in a range of about 800° C. to 1000° C. to have a thickness in a range of about 10 Å to 100 Å. Gate insulating film 440 may also be formed by a dual gate insulating method in NMOS region 4000n and PMOS region 4000p. Further, gate insulating film 440 may be formed by a plasma nitrified oxidation method or a radical oxidation method.

Figure 4E:
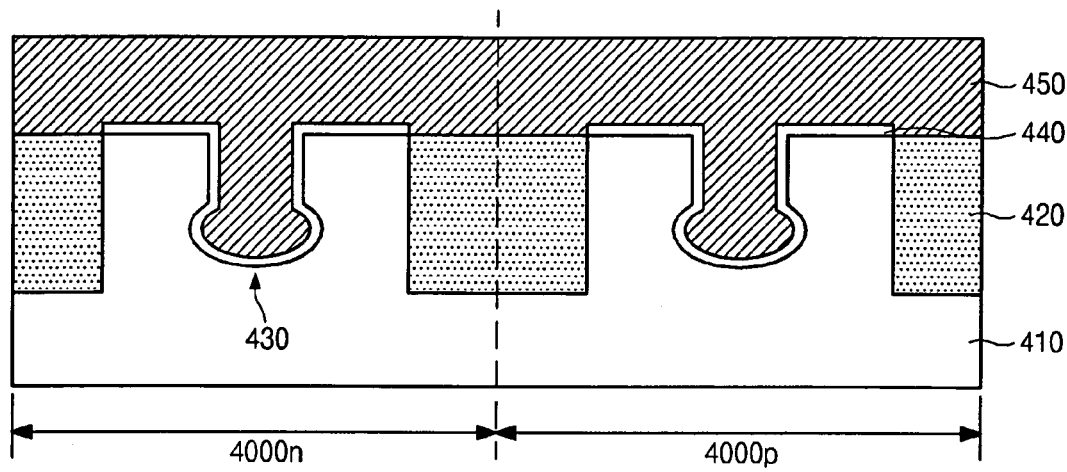
Figure 4F:
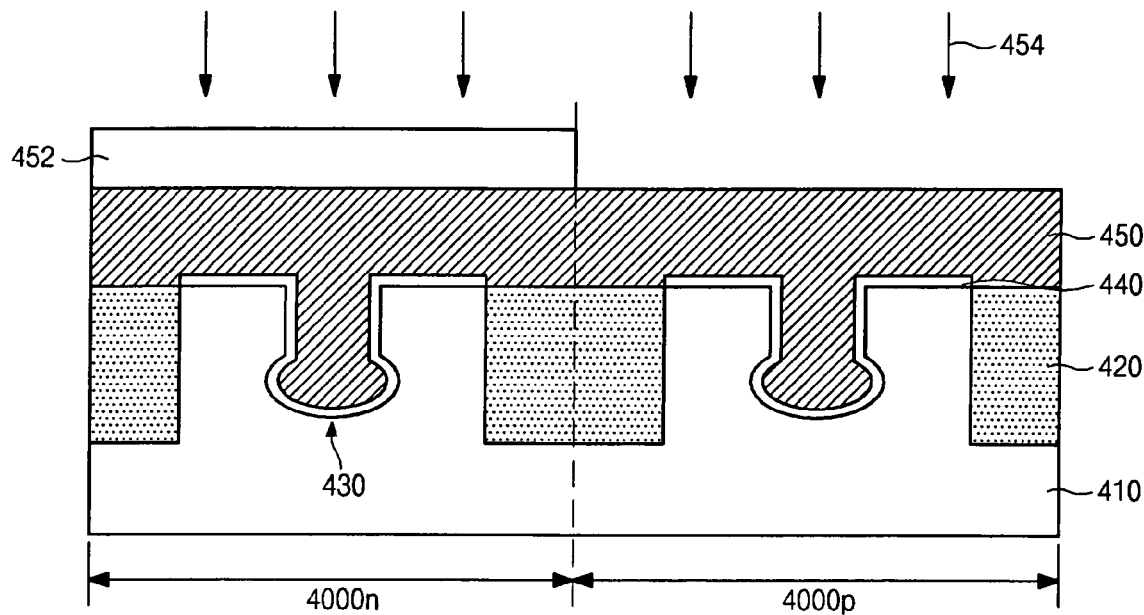

Referring to FIGS. 4e and 4f, a lower gate conductive layer 450 is formed over semiconductor substrate 410 and device isolation structure 420 to fill recess channel structure 430. A photoresist film (not shown) is formed over lower gate conductive layer 450. The photoresist film is exposed and developed using a mask (not shown) to expose PMOS region 4000p, thereby forming a photoresist pattern 452. An ion-implanting process 454 is performed over lower conductive layer 450 to form a PMOS region.

Lower gate conductive layer 450 may include a doped polysilicon layer. The polysilicon layer may be formed by a low pressure chemical deposition ("LPCVD") method using a source gas including $PH_3$ and $SiH_4$ under a pressure in a range of about 5 Torr to 80 Torr and a temperature in a range of about 450° C. to 600° C. to have a thickness in a range of about 500 Å to 1,500 Å. In addition, the polysilicon layer may also be formed under a pressure in a range of about 10 Torr to 30 Torr and a temperature in a range of about 510° C. to 550° C. to have a thickness in a range of about 600 Å to 1,000 Å. A dosage of $PH_3$ may be in a range of about $1.0E20$ ions/cm² to $3.0E20$ ions/cm².

In order to form a PMOS, ion-implanting process 454 is performed by a counter doping process. The counter doping process may be performed using p-type impurities including boron isotope $B^{11}$ with a dosage in a range of about $5.0E15$ ions/cm² to $5.0E17$ ions/cm² and energy in a range of about 1 keV to 10 keV. The counter doping process may also be performed with a dosage in a range of about $1.0E16$ ions/cm² to $9.0E16$ ions/cm² and energy in a range of about 3 keV to 7 keV.

Figure 4G:
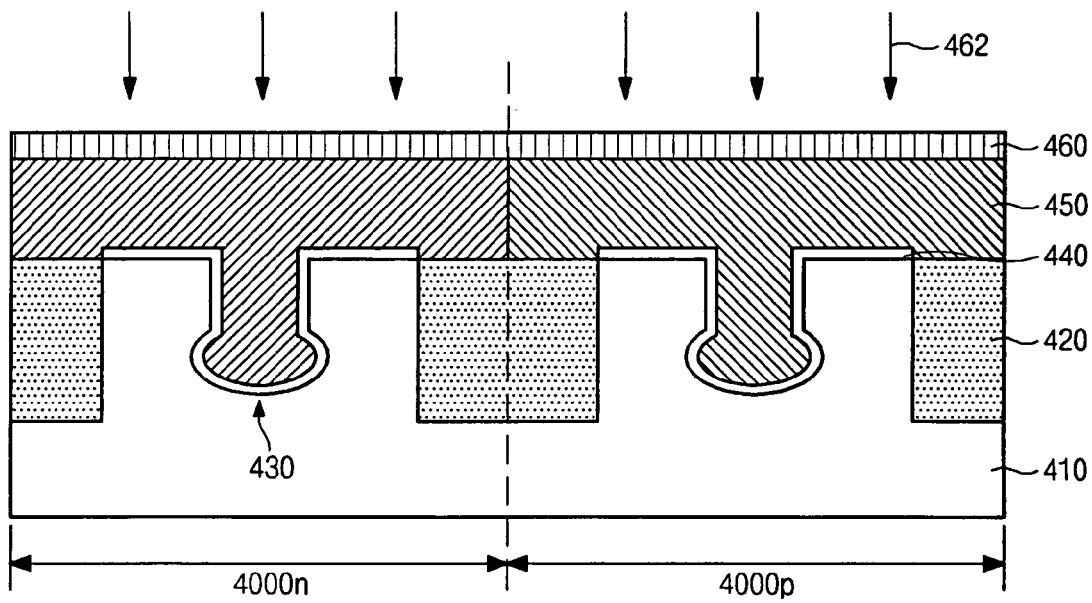
Figure 4H:
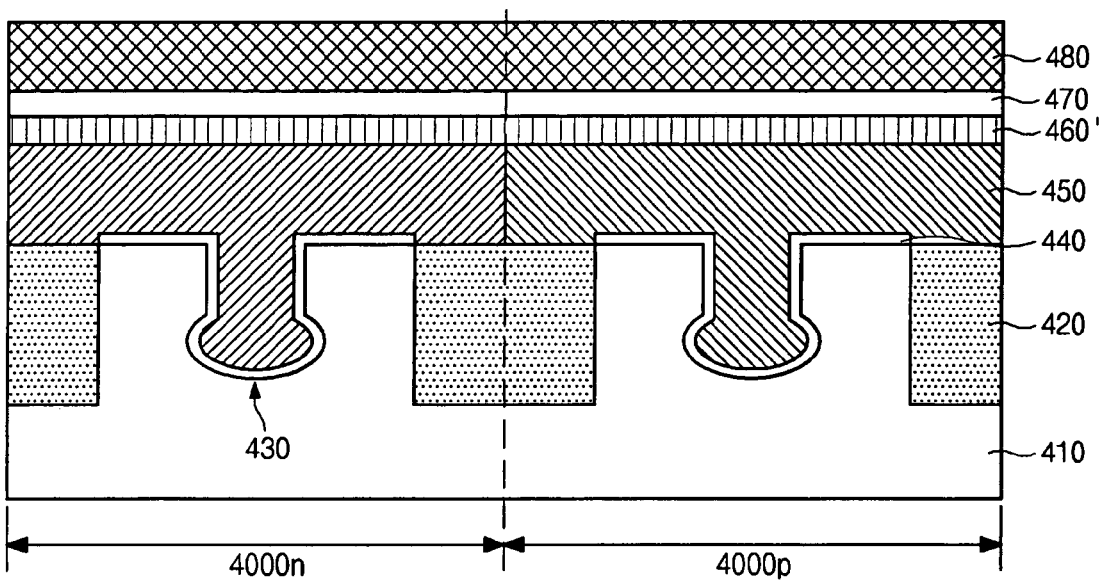
Figure 4I:
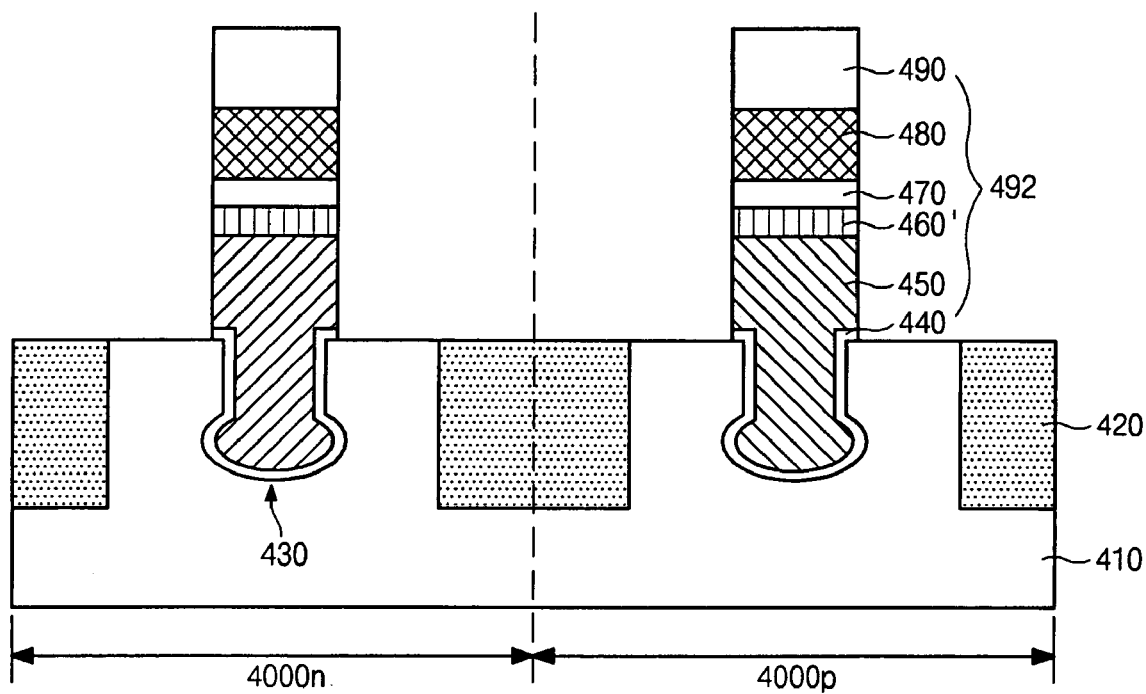

Referring to FIGS. 4g to 4i, photoresist pattern 452 is removed. An undoped amorphous silicon layer 460 for lowering a surface resistance between lower gate conductive layer 450 and upper gate conductive layer 480 is formed over lower gate conductive layer 450. A titanium layer (not shown) is formed over lower gate conductive layer 450. A blanket ion-implanting process 462 is performed on the titanium layer to form amorphous titanium layer 460'.

A barrier layer 470 is formed over amorphous titanium layer 460'. An upper gate conductive layer 480 and a gate hard mask layer 490 are formed over barrier layer 470. Gate hard mask layer 490, upper gate conductive layer 480, barrier layer 470, amorphous titanium layer 460', lower gate conductive layer 450, and gate insulating film 440 are patterned to form a dual poly gate 492 in NMOS region 4000n and PMOS region 4000p.

A thickness of amorphous titanium layer 460' is in a range of about 10 Å to 60 Å, or in a range of about 20 Å to 40 Å. Blanket ion-implanting process 462 may be performed using N-type ions with a dosage in a range of about $1.0E13$ ions/cm² to $1.0E14$ ions/cm² and energy in a range of about 2 keV to 20 keV. In addition, blanket ion-implanting process 462 may also be performed under a dosage in a range of about $1.0E13$ ions/cm² to $9.0E13$ ions/cm² and energy in a range of about 2 keV to 8 keV.

Barrier layer 470 may include a tungsten nitride (WN) film having a thickness in a range of about 20 Å to 100 Å, or in a range of about 30 Å to 70 Å. Amorphous titanium layer 460' and barrier layer 470 are used as a barrier layer between lower gate conductive layer 450 and upper gate conductive layer 480. Upper gate electrode 480 may include a tungsten (W) layer with a thickness in a range of about 200 Å to 1000 Å, or in a range of about 300 Å to 700 Å.

The embodiments consistent with the invention are exemplified to form a dual poly gate. In a device comprising the dual CMOS transistor, such as a flash memory and a SRAM, the invention can be used to reduce the device size and to obtain a high breakdown voltage and a low leakage current. In other words, a device can be embodied, such that a PMOS transistor has a reduced size and a lowered threshold voltage. Also, the device may have a low internal driving voltage and a high punch-through voltage.

As described above, a CMOS transistor having a surface channel can maximize the grain size of an upper gate electrode formed of a tungsten layer, thereby obtaining a dual poly metal gate having a low surface resistance. As a result, the integration of the device is improved to increase production yield of the device and to enhance the PMOS property. Also, the reliability of the device is improved.

The above embodiments consistent with the present invention are illustrative and not limitative. Various alternatives and equivalents are possible. The invention is not limited by the types of deposition, etching, polishing, and patterning steps described herein. Nor is the invention limited to any specific types of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A semiconductor device, comprising:
   a semiconductor substrate including an NMOS region and a PMOS region;
   active regions of the semiconductor substrate defined by a device isolation structure formed in the semiconductor substrate, the active regions including an NMOS active region defined in the NMOS region, and a PMOS active region defined in the PMOS region;
   a gate insulating film disposed over the active regions; and
   a gate including an amorphous titanium layer formed over the gate insulating film in the NMOS region and the PMOS region.

2. The semiconductor device of claim 1, wherein a thickness of the amorphous titanium layer is in a range of about 20 Å to 60 Å.

3. The semiconductor device of claim 1, the gate is a dual poly gate.

4. The semiconductor device of claim 1, further comprising three-dimensional recess channel structures formed in the semiconductor substrate in the active regions.

5. A semiconductor device, comprising:
   a semiconductor substrate including an NMOS region and a PMOS region;
   active regions of the semiconductor substrate defined by a device isolation structure formed in the semiconductor substrate, the active regions including an NMOS active region defined in the NMOS region, and a PMOS active region defined in the PMOS region;
   three-dimensional recess channel structures formed in the semiconductor substrate in the active regions;
   a gate insulating film disposed over the active regions, the active regions including the three-dimensional recess channel structures; and
   a dual poly gate including an amorphous titanium layer formed over the gate insulating film, the dual poly gate filling the three-dimensional recess channel structures, wherein:
   the dual poly gate includes a stacked structure having a lower gate electrode, a barrier layer including the amorphous titanium layer, and an upper gate electrode; the lower gate electrode comprises an n-type impurity doped polysilicon layer in the NMOS region and a p-type impurity doped polysilicon layer in the PMOS region; and the upper gate electrode comprises a tungsten layer.

6. The semiconductor device of claim 5, wherein the three-dimensional recess channel structures comprises a bulb-type structure.

7. The semiconductor device of claim 5, wherein the barrier layer comprises a stacked structure of the amorphous titanium layer and a tungsten nitride film.

8. A method for fabricating a semiconductor device, the method comprising:
   forming a device isolation structure on a semiconductor substrate including an NMOS region and a PMOS region to define active regions in at least the NMOS region and the PMOS region;
   forming a gate insulating film over the active regions;
   forming an n-type first conductive layer over the gate insulating film in the NMOS region and a p-type first conductive layer over the gate insulating film in the PMOS region;
   forming a barrier layer including an amorphous titanium layer over the n-type conductive layer and the p-type conductive layer;
   forming a second conductive layer over the barrier layer; and
   patterning the second conductive layer, the barrier layer, and the first conductive layer to form a gate structure.

9. The method of claim 8, wherein forming the n-type first conductive layer further comprises:
   forming an amorphous silicon layer over the device isolation structure and the gate insulating film; and
   doping impurity ions into the amorphous silicon layer, wherein the impurity ion comprises a phosphorus isotope or a boron isotope.

10. The method of claim 9, wherein forming the amorphous silicon layer further comprises using a source gas including $Si_2H_6$ under a pressure in a range of about 0.1 Torr to 1.0 Torr and a temperature in a range of about 450° C. to 600° C.

11. The method of claim 9, wherein the impurity ions doping process is performed using an ion dosage in a range of about $1.0E15$ ions/cm$^2$ to $6.0E15$ ions/cm$^2$ and an energy in a range of about 3 keV to 30 keV.

12. The method of claim 8, wherein forming the barrier layer further comprises:
   forming a titanium layer over the first conductive layer; and
   implanting ions into the titanium layer.

13. The method of claim 12, wherein implanting the ions further comprises implanting an impurity using n-type ions with a dosage in a range of about $1.0E13$ ions/cm$^2$ to $1.0E14$ ions/cm$^2$ and an energy in a range of about 2 keV to 20 keV.

14. The method of claim 12, further comprising forming a tungsten nitride film over the amorphous titanium layer.

15. A method for fabricating a semiconductor device, the method comprising:
   forming a device isolation structure on a semiconductor substrate including an NMOS region and a PMOS region to define active regions in at least the NMOS region and the PMOS region;
   forming a three-dimensional recess channel structure in the semiconductor substrate in the active regions;
   forming a gate insulating film over the active regions including the three-dimensional recess channel structure;
   forming an impurity doped polysilicon layer over the gate insulating film to fill the three-dimensional recess channel structure;
   forming a barrier layer including an amorphous titanium layer over the impurity doped polysilicon layer;
   forming a tungsten layer over the barrier layer; and
   patterning the tungsten layer, the barrier layer, and the impurity doped polysilicon layer to form a dual poly gate, wherein the dual poly gate includes an NMOS gate structure in the NMOS region and a PMOS gate structure in the PMOS region.

16. The method of claim 15, wherein the gate insulating film is formed by a dual gate insulating method, the gate insulating film having different thicknesses in the NMOS region and the PMOS region.

17. The method of claim 15, wherein the impurity doped polysilicon layer is formed by a LPCVD method using a source gas material including $PH_2$ and $SiH_4$.

18. The method of claim 15, wherein forming the barrier layer further comprises:
   forming a titanium layer over the conductive layer; and
   implanting ions into the titanium layer.

19. The method of claim 18, wherein implanting the ions further comprises implanting an impurity using n-type ions with a dosage in a range of about $1.0E13$ ions/cm$^2$ to $1.0E14$ ions/cm$^2$ and an energy in a range of about 2 keV to 20 keV.

20. A gate electrode for a semiconductor device, comprising:
  a lower gate electrode;
  an upper gate electrode over the lower gate electrode; and
  a barrier layer between the lower gate electrode and the upper gate electrode, the barrier layer comprising an amorphous titanium layer.

* * * * *